United States Patent [19]

Yoshida et al.

[11] Patent Number: 4,742,583
[45] Date of Patent: May 10, 1988

[54] WATER SUPPLY CONTROL APPARATUS

[75] Inventors: Takao Yoshida; Kiyoshi Fujino, both of Fukuoka, Japan

[73] Assignee: Toto Ltd., Fukuoka, Japan

[21] Appl. No.: 947,522

[22] Filed: Dec. 29, 1986

[30] Foreign Application Priority Data

Dec. 28, 1985 [JP] Japan .................................. 60-299515

[51] Int. Cl.$^4$ .............................................. E03D 5/10
[52] U.S. Cl. .......................................... 4/313; 4/304; 4/623
[58] Field of Search ................... 4/302, 304, 305, 313, 4/623

[56] References Cited

U.S. PATENT DOCUMENTS 4,651,777  3/1987  Hardman ........................... 4/623 X

FOREIGN PATENT DOCUMENTS 3008025  9/1981  Fed. Rep. of Germany .......... 4/313

Primary Examiner—Charles E. Phillips
Attorney, Agent, or Firm—Lowe, Price, Le Blanc, Becker & Shur

[57] ABSTRACT

A water supply control apparatus includes a flushing device to be supplied with water, a water supply valve for controlling the supply of water to the flushing device, a driving signal generator for selectively generating driving signals of first and second periods, respectively, a sensor responsive to one, at a time, of the driving signals for detecting whether there is a user of the flushing device at one of the first and second periods, to produce a sensor signal selectively including a user-present signal and a user-absent signal of the one period, and a control circuit responsive to the sensor signal for controlling the water supply valve. The control circuit includes a first control section having a switching element responsive to the user-absent signal for issuing a first switching signal to the driving signal generator to generate the driving signal of the first period and responsive to the user-present signal for issuing a second switching signal to the driving signal generator to generate the driving signal of the second period and an output element responsive to the sensor signal for issuing a water supply valve control signal, a second control section responsive to the water supply valve control signal for controlling the water supply valve, and a battery as a power supply for operating the water supply valve, the driving signal generator, the sensor, the first and second control sections. The second period is shorter than the first period.

15 Claims, 13 Drawing Sheets

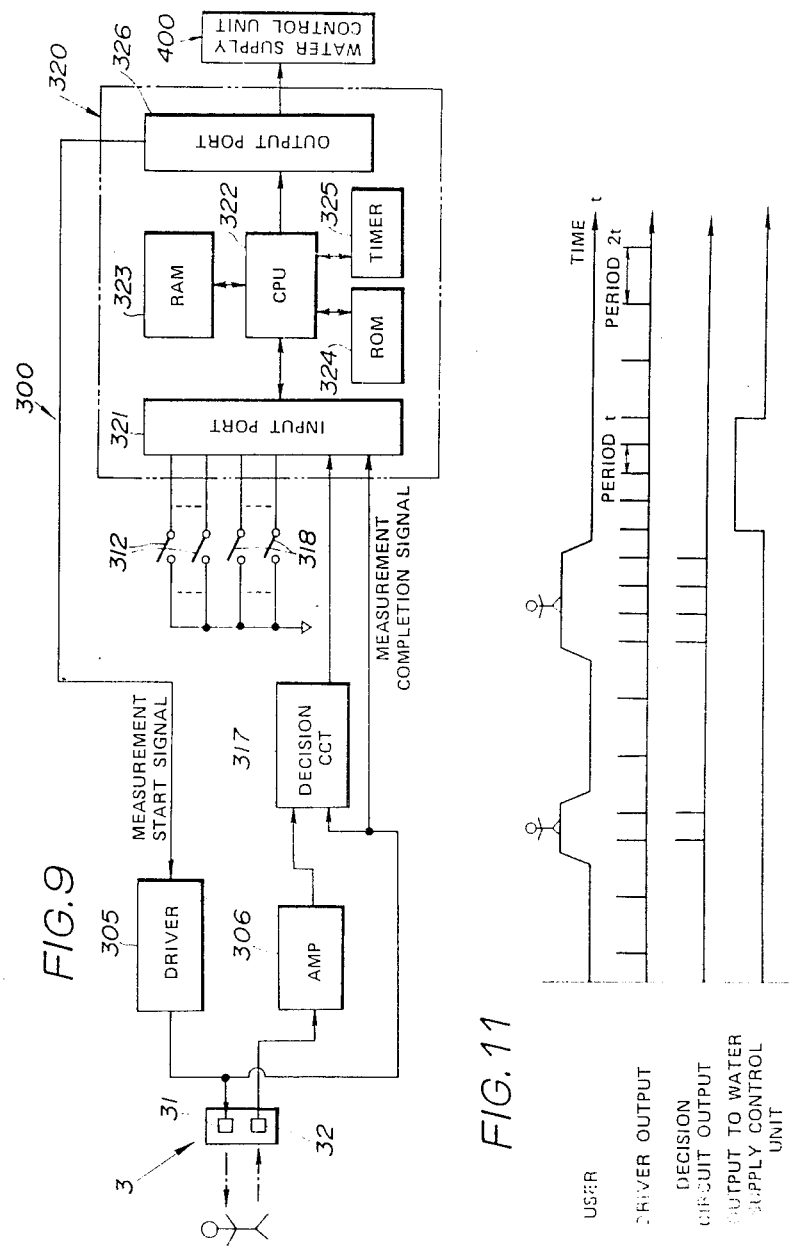

WATER SUPPLY CONTROL APPARATUS

BACKGROUND OF THE INVENTION

1. Field of the Invention

The present invention relates to a water supply control apparatus, and more particularly to a water supply control apparatus having a battery as a power supply for controlling the supply of water to a flushing device.

2. Description of the Prior Art

Known water supply control apparatus having a battery as a power supply for automatically controlling the supply of water to a flushing device such as a flush toilet or a wash bowl include a sensor for controlling the water supply by sensing the user who is approaching or using the flushing device. For example, Japanese Laid-Open Patent Publication No. 59-126831 published July 21, 1984 discloses a toilet flushing apparatus which essentially includes a sensor unit comprising a light-emitting element for emitting infrared radiation at all times and a light detector element, an electric circuit, a solenoid-operated valve for supplying water, and a battery as a power supply for driving the various components. The sensor unit is in the form of a photoelectric sensor of the diffused reflection type in which several thousands of pulses of infrared radiation are generated by the light-emitting element per second, and the light detector element detects infrared radiation pulses reflected from the user of the toilet for producing a sensor signal.

Since the sensor unit continuously emits infrared rays at all times, it consumes a large amount of electric power and hence the power supply battery is required to be replaced frequently as its service life is generally short. Such frequent battery replacement is awkward and uneconomical.

SUMMARY OF THE INVENTION

In view of the aforesaid drawback of the conventional water supply control apparatus, it is an object of the present invention to provide a water supply control apparatus which can selectively reduce the frequency of sensing the user without substantially lowering the accuracy of response by increasing the interval of sensing cycles of a sensor unit when the sensor unit is not sensing the user of a flushing device and by reducing the interval of sensing cycles when the sensor unit is sensing the user, so that a battery used as a power supply may be of a relatively low power requirement.

According to the present invention, there is provided a water supply control apparatus including a flushing device to be supplied with water, water supply valve means for controlling the supply of water to the flushing device, driving signal generator means for selectively generating driving signals of first and second periods, respectively, sensor means responsive to one, at a time, of the driving signals for detecting whether there is a user of the flushing device at one of the first and second periods, to produce a sensor signal selectively including a user-present signal and a user-absent signal of said one period, and control circuit means responsive to the sensor signal for controlling the water supply valve means, the control circuit means including first control means having switching means responsive to the user-absent signal for issuing a first switching signal to the driving signal generator means to generate the driving signal of the first period and responsive to the user-present signal for issuing a second switching signal to the driving signal generator means to generate the driving signal of the second period and output means responsive to the sensor signal for issuing a water supply valve control signal, second control means responsive to the water supply valve control signal for controlling the water supply valve means, and a battery as a power supply for operating the water supply valve means, the driving signal generator means, the sensor means, the first and second control means.

The second period is shorter than the first period. The sensor means comprises an infrared radiation sensor having a light-emitting element and a light detector element.

The above and further objects, details and advantages of the present invention will become apparent from the following detailed description of preferred embodiments thereof, when read in conjunction with the accompanying drawings.

BRIEF DESCRIPTION OF THE DRAWINGS

FIG. 9 is a block diagram of a user sensor control unit according to a second embodiment of the present invention;

FIG. 11 is a timing chart of operation of the user sensor control unit shown in FIG. 9;

DESCRIPTION OF THE PREFERRED EMBODIMENTS

Figure 1:
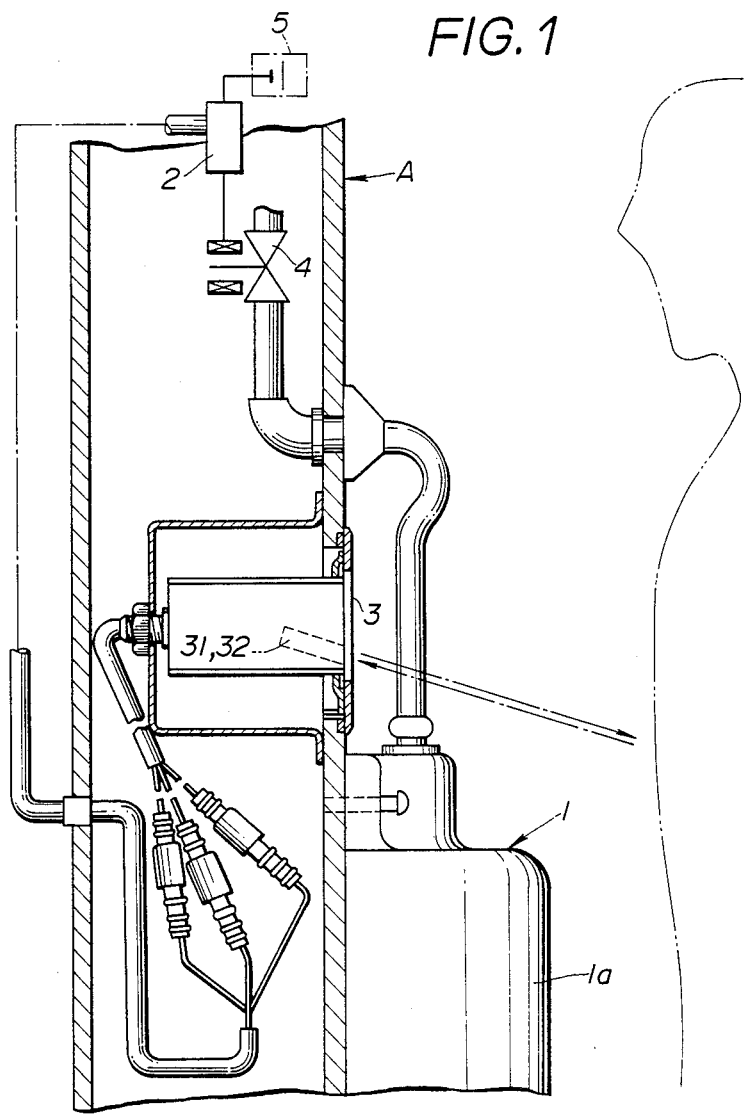
FIG. 1 is a vertical cross-sectional view of a water supply control apparatus according to a first embodiment of the present invention.

As shown in FIG. 1, a water supply control apparatus according to a first embodiment of the present invention is employed to control a flushing device 1 in the form of a urinal 1a. A sensor unit 3 is embedded in a wall A at a height that is approximately equal to the height of the chest of users as they stand in front of the urinal 1a. A water supply mechanism 4 for supplying water to the urinal includes a latching solenoid.

The sensor unit 3 comprises an infrared radiation sensor having a light-emitting element 31 in the form of a light-emitting diode and a light detector element 32 in the form of a phototransistor. The sensor unit 3 is coupled via a controller 2 to a battery 5 serving as a driving power supply.

The light-emitting element 31 is coupled to a driver circuit 305 (FIG. 2) in the controller 2 and energizable thereby to emit infrared radiation. The emitted infrared radiation is reflected by a user who is standing in front of the urinal 1a for urinary purpose and is partly received by the light detector element 32, which then applies a sensor signal to the controller 2 that controls the supply of water to the urinal 1a and the cyclic period of infrared emission by the light-emitting element 31.

Figure 2:
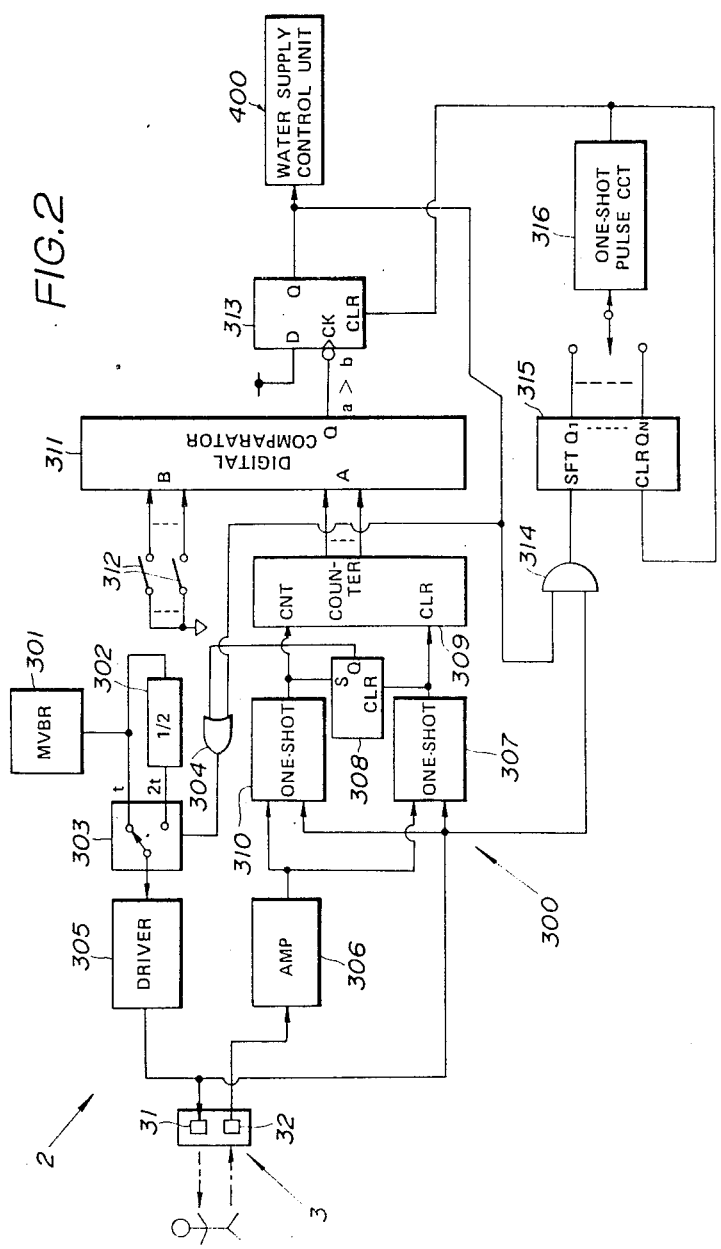
FIG. 2 is a block diagram of a user sensor control unit of the water supply control apparatus of the first embodiment.

As illustrated in FIG. 2, the controller 2 generally includes a user sensor control unit 300 connected to the sensor unit 3 and a water supply control unit 400 for energizing the latching solenoid 4 in response to an output signal from the user sensor control unit 300. In this embodiment, the user sensor control unit 300 is constructed of hardware only.

The user sensor control unit 300 will first be described below with reference to FIG. 2. The user sensor control unit 300 has a multivibrator 301 which successively generates a pulse signal at a predetermined cyclic period t such as 1 second (t=1) and applies the pulse signal to a ½ frequency divider 302 and a multiplexer 303.

The ½ frequency divider 302 produces a successive pulse signal having a frequency that is half the frequency of the pulse signal from the multivibrator 301, i.e., at a cyclic period 2t or 2 seconds. This pulse signal of the period 2t is also applied to the multiplexer 303.

The multiplexer 303 is responsive to a switching or selection signal from an OR gate 304 for issuing either the pulse signal of the period t from the multivibrator or the pulse signal of the period 2t from the ½ frequency divider 302. The selected periodic output signal from the multiplexer 303 is applied to the driver circuit 305 to enable the latter to drive the light-emitting element 31 to emit infrared radiation at a cyclic period synchronous with the cyclic period of the output signal from the multiplexer 303. Therefore, the cyclic period of infrared emission from the light-emitting element 31 is selected to be t or 2t by the selection signal from the OR gate 304.

The light detector element 32 is connected to an amplifier circuit 306 coupled to a reflection-present one-shot circuit 310 and a reflection-absent one-shot circuit 307. When there is no infrared reflection on the light detector element 32 even if infrared radiation is emitted by the light-emitting element 31, the reflection-absent one-shot circuit 307 is energized to produce a one-shot pulse signal that is applied to a CLEAR terminal of a flip-flop 308 and a CLEAR terminal of a counter 309. When reflected infrared radiation falls on the light detector element 32, the reflection-present one-shot circuit 310 produces a one-shot pulse signal which is delivered to a SET terminal of the flip-flop 308 and a COUNT terminal of the counter 309.

In the absence of any user in front of the urinal 1a, the multiplexer 303 selects the period 2t and infrared radiation is emitted by the light-emitting element 31 at the cyclic period 2t. Since the pulse signal from the reflection-absent one-shot circuit 307 is applied to the CLEAR terminal of the flip-flop 308, the flip-flop 308 issues a low-level output signal, which is fed to the OR gate 304. The multiplexer 303 keeps on selecting the period 2t inasmuch as no output signal is applied by a flip-flop 313 to the water supply control unit 400, as described later on.

When the light detector element 32 detects even one pulse of infrared reflection thereby sensing the user, the reflection-present one-shot circuit 310 applies the signal to the SET terminal of the flip-flop 308 which applies a high output signal to the OR gate 304. The multiplexer 303 is now switched to select the period t as shown in FIG. 2, and from that time on the light-emitting element 31 emits infrared radiation at the period t.

With no user detected, the reflection-absent one-shot circuit 307 applies the pulse signal to the CLEAR terminal of the counter 309 to keep its count at zero. If a user is detected, then the pulse signal is applied by the reflection-present one-shot circuit 310 to the COUNT terminal of the counter 309, which starts counting the pulse signal. As long as the user is being detected, the count of the counter 309 is incremented each time a pulse signal is applied by the relection-present one-shot circuit 310 to the COUNT terminal of the counter 309, and is supplied to a digital comparator 311. When the user thereafter leaves the urinal 1a, a pulse signal is applied by the reflection-absent one-shot circuit 308 to the CLEAR terminal of the counter 309 to reset the count to "0".

The digital comparator 311 compares a count (a) from the counter 309 with a preset detected count (b), such for example "2" (b=2), preset by a detected count setting circuit 312. If the count (a) is smaller than the preset detected count (b), then the digital comparator 311 issues no output signal. Conversely, if the count (a) grows larger than the preset detected count (b), then the digital comparator 311 applies a high signal to the flip-flop 313. The digital comparator 311 thereafter issues a low signal when the count (a) is reset to "0".

When the input signal from the digital comparator 311 falls from the high level to the low level, the flip-flop 313 applies a high signal to one input terminal of an AND gate 314 and the water supply control unit 400. The other input terminal of the AND gate 314 is coupled to the driver circuit 305. When there is an output signal from the driver circuit 305 and the flip-flop 313 applies a high signal to the water supply control unit 400, the AND gate 314 applies an output signal to a SHIFT terminal of a shift register 315.

The shift register 315 has a plurality of output terminals Q1 - Qn which successively go high each time an output signal is applied by the AND gate 314 to the SHIFT terminal of the shift register 315, the number of the output terminals Q1 - Qn determining a preset output count. In the illustrated embodiment, when the fourth output Q4 goes high, the shift register 315 enables a one-shot pulse circuit 316 to issue a pulse signal.

The pulse signal from the one-shot pulse circuit 306 is applied to CLEAR terminals of the shift register 315 and the flip-flop 313 to clear them. The output applied by the flip-flop 313 to the water supply control unit 400 and also to the OR gate 304 now goes low. Therefore, when the user has used the urinal while four pulses are being issued from the reflection-present one-shot circuit 310 and when the user has then left the urinal 1a, the flip-flop 313 applies a high signal to the water supply control unit 400. When the first through fourth Q outputs of the shift register 315 go high, the shift register 315 enables the one-shot pulse circuit 316 to apply a pulse signal to the CLEAR terminal of the flip-flop 313 for thereby changing the output signal thereof from the high level to the low level. Since there is no user in front of the urinal 1a at this time, the output signal from the flip-flop 308 is low and no output signal is produced by the OR gate 304. Thus, the multiplexer 303 now selects the period 2t. Thereafter, the light-emitting element 31 emits infrared radiation at the cyclic period 2t.

Figure 3:
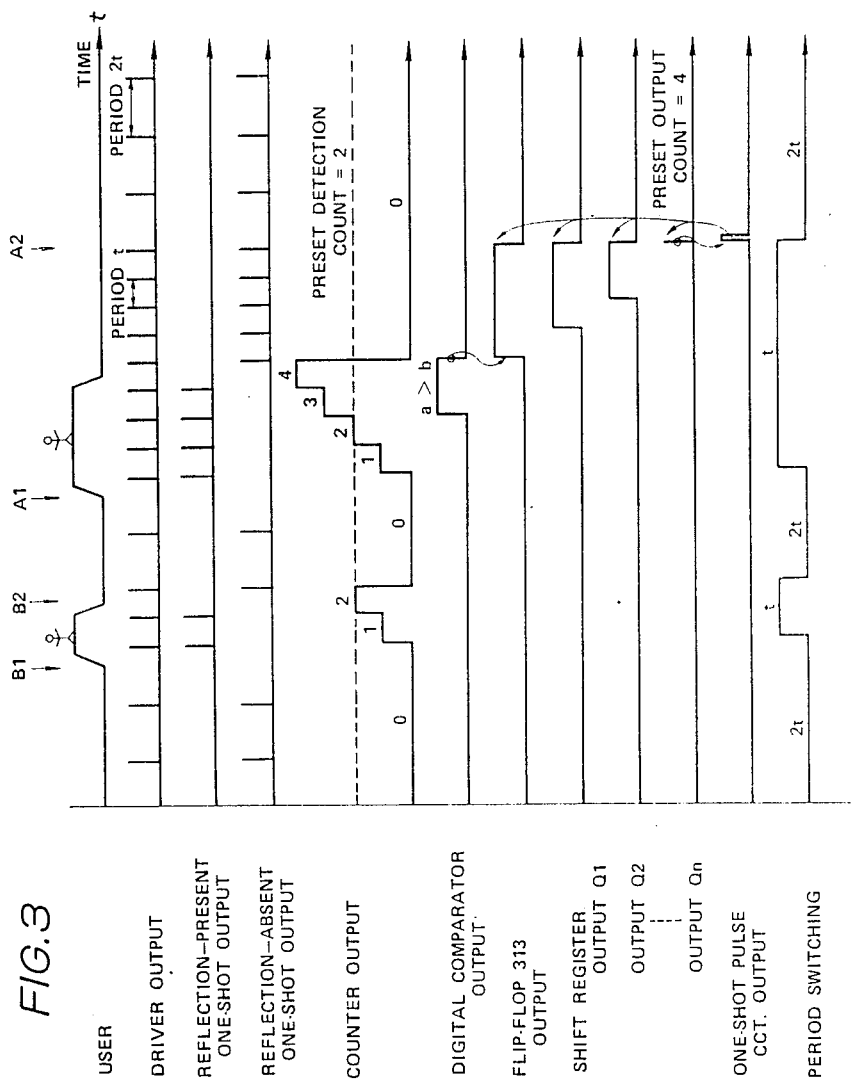
FIG. 3 is a timing chart of signals in the user sensor control unit shown in FIG. 2.

FIG. 3 shows a timing chart of operation of the user sensor control unit 300.

The aforesaid process is mainly concerned with the operation of the user sensor control unit 300 from the time A1 to the time A2 of the timing chart. If the time interval between the time B1 when the user stands in front of the urinal 1a and the time B2 when the user leaves the urinal 1a is relatively short, i.e., if the user leaves the urinal 1a when the counter 309 counts up to "2", then the multiplexer 303 changes the cyclic period to t during that time interval but the digital comparator 311 does not apply a high signal to the flip-flop 313 inasmuch as the count "2" is not larger than the preset count "2". Therefore, the output signal from the flip-flop 313 remains low. The output signal from the flip-flop 308 also returns to low because there is no user in front of the urinal 1a after the count "2" has been reached. The cyclic period is now changed from t to 2t by the multiplexer 303, and infrared radiation is emitted from the light-emitting element 31 at the period 2t from the time B2 on.

Figure 4:
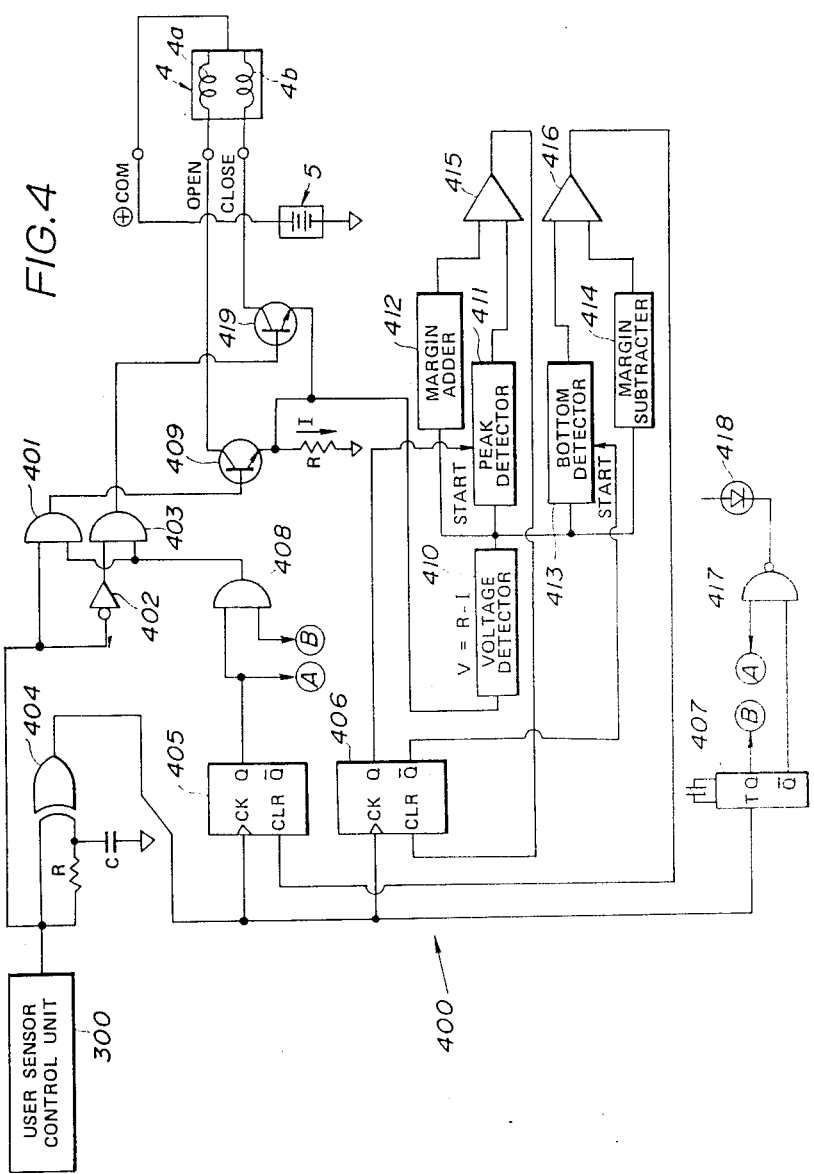
FIG. 4 is block diagram of a water supply control unit of the water supply control apparatus of the first embodiment.

The water supply control unit 400 is illustrated in detail in FIG. 4. The high output signal from the flip-flop 313 is applied to an AND gate 401, to an AND gate 403 via a NOT gate 402, and also to an exclusive-OR gate 404. The exclusive-OR gate 404 has one input terminal coupled to a resistor R and a capacitor C so that the exclusive-OR gate 404 issues an output pulse signal when the output signal from the flip-flop 313 changes from the high level to the low level and from the low level to the high level.

While the urinal 1a is not being used, the input signal applied to the exclusive-OR gate 404 is low and hence the exclusive-OR gate 404 does not issue an output pulse signal. Therefore, driver transistors 409, 419 remain turned off.

Upon transition from the low level to the high level of the output signal applied by the flip-flop 313 to the water supply control unit 400, a high signal is applied to one input terminal of the AND gate 401, and a low signal is applied to one input terminal of the AND gate 403 via the NOT gate 402. At the same time, the exclusive-OR gate 404 issues an output pulse signal.

The pulse signal from the exclusive-OR gate 404 is applied to a flip-flop 405 to enable the flip-flop 405 to produce a high output signal, to a flip-flop 406 to make its Q output high and its $\overline{Q}$ output low, and also to a 50-msec one-shot timer 407 to start the same for thereby rendering its Q output high. The output signals from the flip-flop 205 and the 50-msec one-shot timer 407 are applied to an AND gate 408. Since these applied output signals are high, the AND gate 408 applies a high signal to the other input terminals of the AND gates 401, 403. Consequently, the AND gate 401 is enabled by the high input signals applied thereto, applying a high output signal to the base of the driver transistor 409 to render the same conductive.

When the driver transistor 409 is turned on, it allows a driving current I to flow from the battery 5 through a plunger-operating coil 4a of the latching solenoid 4. The driving current I then flows through the driver transistor 409 and a resistor R back to the battery 5. A voltage induced across the resistor R is detected by a voltage detector 410, and applied to a peak detector 411, a margin adder 412, a bottom detector 413, and a margin subtracter 414.

When the Q output of the flip-flop 406 goes high, it starts operating the peak detector 411. Since the $\overline{Q}$ output of the flip-flop 406 is low, the bottom detector 413 does not start its operation.

Figure 5:
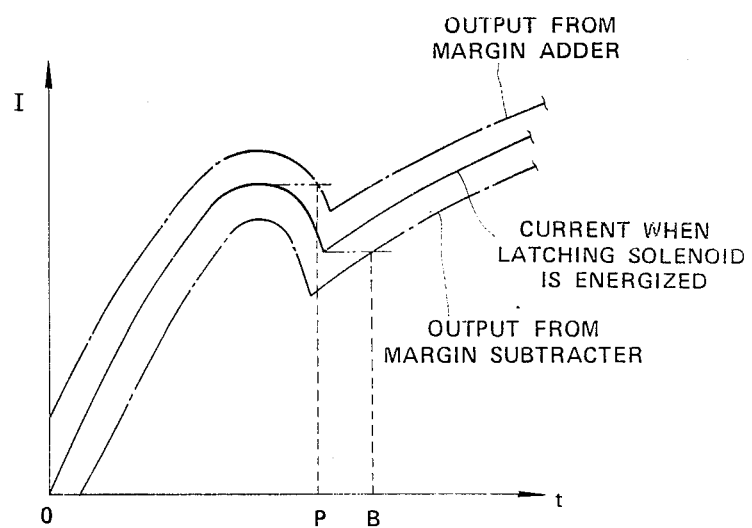
FIG. 5 is a graph showing a current plotted against time when a latching solenoid is energized in the first embodiment.

As shown in FIG. 5, a current flowing when the latching solenoid 4 is energized is increased with time as a current is supplied to the plunger-operating coil 4a or a plunger-returning coil 4b. Upon lapse of a certain time, the current is temporarily reduced due to a counter electromotive force produced by movement of a plunger 4c (described later). Then, the current keeps on increasing from the time when the counter electromotive force is eliminated as a valve mechanism 4d (described later) is opened or closed. It has been found that the time required for the current to start flowing, fall, and then increase again is within about 10 msec. at maximum.

The peak detector 411 follows a highest voltage only. It detects a maximum current value when a current is supplied to the plunger-operating coil 4a, and issues the maximum current value to a peak-detecting comparator 415. The peak-detecting comparator 415 compares the maximum current value from the peak detector 411 and an output from the margin adder 412 which is the sum of the current flowing when the latching solenoid 4 is energized and a prescribed margin. When the output from the margin adder 412 is lowered beyond the maximum current value, the peak-detecting comparator 415 applies an output signal to a CLEAR terminal of the flip-flop 406. Now, the Q output from the flip-flop 406 goes low to stop the operation of the peak detector 411, and the $\overline{Q}$ output from the flip-flop 406 goes high to start operating the bottom detector 413.

The bottom detector 413 follows a lowest voltage only. It detects a minimum current value when the valve mechanism 4d is opened, i.e., the counter electromotive force is zero, and issues the minimum current value to a bottom-detecting comparator 416. The bottom-detecting comparator 416 compares the minimum current value from the bottom detector 413 and an output from the margin subtracter 414 which is produced by subtracting a prescribed margin from the current flowing when the latching solenoid 4 is energized. When the output from the margin substracter 414 is increased beyond the minimum current value, the bottom-detecting comparator 416 applies an output signal to a CLEAR terminal of the flip-flop 405. Now, the output from the flip-flop 405 goes low to disable the AND gate 408, which then applies a low signal to the AND gate 401. The driver transistor 409 is turned off to cut off the driving current I from the battery 5 to the plunger-operating coil 4a. This means the complete supply of water to the urinal 1a by the latching solenoid 4 as described later.

In response to an output signal from the shift register 315, the one-shot pulse circuit 316 generates a pulse signal which causes the output signal from the flip-flop 313 to the water supply control unit 400 to change from the high level to the low level. The low signal is applied to the input terminal of the AND gate 401, and at the same time the high signal is applied via the NOT gate 402 to the input terminal of the AND gate 403. Simultaneously, the exclusive-OR gate 404 applies a pulse signal to the flip-flops 405, 406 and the 50-msec one-shot timer 407. The AND gate 403 is now enabled to turn on the driver transistor 419. As the driver transistor 419 is energized, the driving current I is supplied from the battery 5 to the plunger-returning coil 4b of the latching solenoid 4.

Subsequently, a maximum current value detected by the peak detector 411 by supplying the current to the plunger-returning coil 4b and a margin-added output from the margin adder 412 are compared by the peak-detecting comparator 415. When the margin-added output is lowered beyond the maximum current value, the flip-flop 406 is cleared. A minimum current value detected by the bottom detector 413 when the valve mechanism 4d is closed and a margin-subtracted output from the margin subtracter 414 are compared by the bottom-detecting comparator 416. When the margin-subtracted output is increased beyond the minimum current value, the flip-flop 405 is cleared, turning off the driver transistor 419, whereupon the driving current I supplied from the battery 5 to the plunger-returning coil 4b is cut off. This means the complete shut-off of water supply to the urinal 1a.

Figure 6:
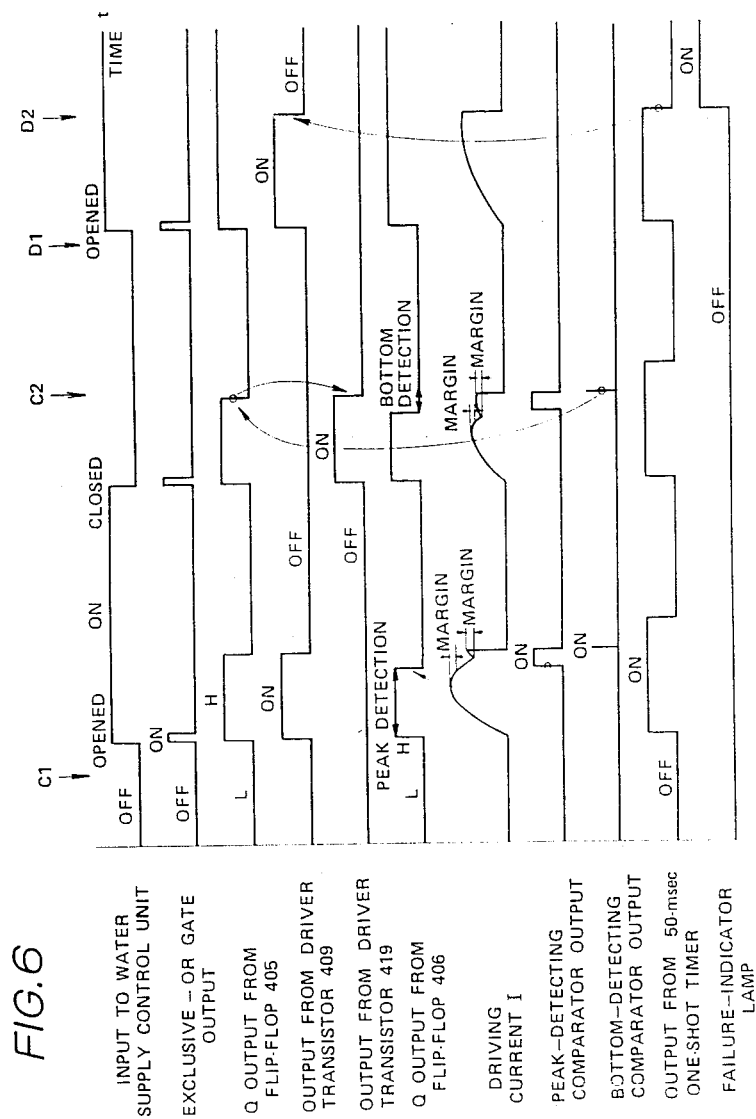
FIG. 6 is a timing chart of signals in the water supply control unit illustrated in FIG. 4.

FIG. 6 shows a timing chart illustrative of operation of the water supply control unit 400. The above process is mainly representative of the operation of the water supply control unit 400 from the time C1 to the time C2. While the driver transistor 409 is being energized, the output from the margin adder 412 may not be lowered beyond the maximum current value or the output from the margin subtracter 414 may not be increased beyond the minimum current value. In such a case, since there is no input applied to the CLEAR terminal of the flip-flop 405, the driver transistor 409 would remain energized, failing to cut off the current supply from the battery 5 to the plunger-operating coil 4a which would remain continuously energized. However, upon lapse of 50 msec. after the input signal applied to the water supply control unit 400 has gone high, the 50-msec one-shot timer 407 runs out, rendering the Q output thereof low. The output from the AND gate 408 then changes from the high level to the low level, and this turns off the driver transistor 409, cutting off the current supplied from the battery 5 to the plunger-operating coil 4a. Since the $\overline{Q}$ output of the timer 407 goes high at the same time, the output signal from a NAND gate 417 goes low to energize a failure-indicator lamp 418, apprising the user of the abnormal condition. The foregoing operation is indicated in FIG. 6 from the time D1 to the time D2 and from the time D2 on.

Figure 7:
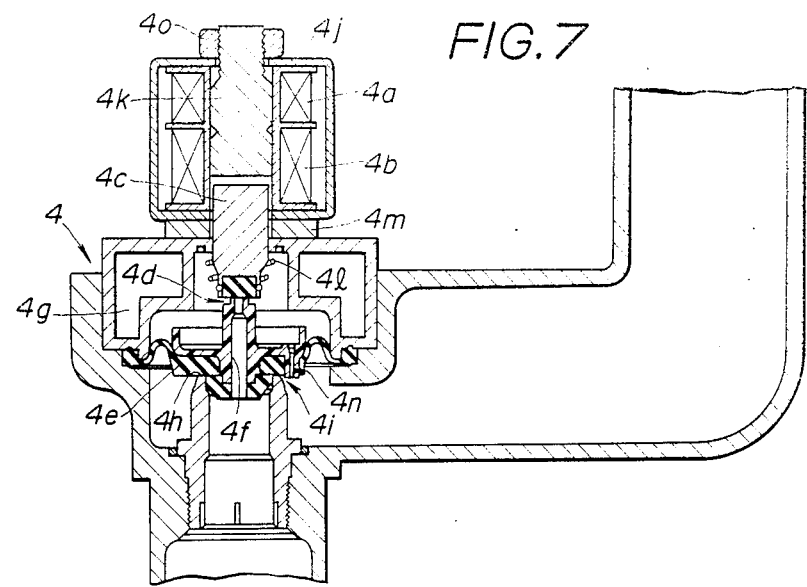
FIG. 7 is an enlarged vertical cross-sectional view of a water supply mechanism, showing a main valve in a closed position.
Figure 8:
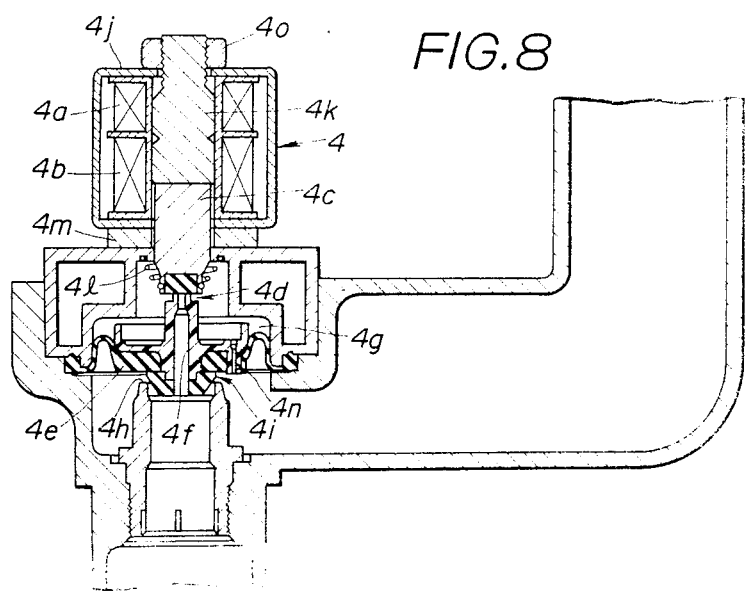
FIG. 8 is a view similar to FIG. 7, showing the main valve in an open position.

The latching solenoid 4 is illustrated in detail in FIGS. 7 and 8. The plunger 4c of the latching solenoid 4 is vertically movable to open or close the valve mechainsm 4d in response to energization of the plunger-operating coil 4a or the plunger-returning coil 4b. The plunger 4c has a lower surface which is movable into or out of contact with the upper end of a vertical pilot hole 4f defined centrally through a diaphragm 4e to close or open the valve mechainsm 4d, thereby introducing water into or discharging water out of a pressure chamber 4g defined behind the diaphragm 4e. The diaphragm 4e is now vertically moved to bring its lower surface into or out of contact with a valve seat 4h for thereby closing or opening a main valve 4i to cut off or supply water to the urinal 1a.

More specifically, the plunger-operating coil 4a and the plunger-returning coil 4b are stacked in a metallic case 4j. A metallic head 4k is inserted through the coils 4a, 4b and has an externally threaded upper end fixed by a nut 4o to the case 4h. The plunger 4c is disposed below the head 4k. The plunger 4c is vertically movably disposed in the plunger-returning coil 4b and normally urged to move in a valve-closing direction or a downward direction by a compression coil spring 41. A permanent magnet 4m is disposed around the plunger 4c in abutment against the lower surface of the case 4j.

Operation of the latching solenoid 4 is as follows: When no user is detected in front of the urinal, the plunger 4c is resiliently biased under the force of the spring 41 to close the pilot hole 4f. The magnetic flux from the permanent magnet 4m acts to pull the plunger 4c thereby to keep the pilot hole 4f closed by the lower end of the plunger 4c. The main valve 4i therefore remains closed.

When the plunger-operating coil 4a is energized, it produces a magnetic flux tending to pull the plunger 4c upwardly. As the magnetic flux thus produced is progressively increased, the plunger 4c starts moving upwardly, producing a counter electromotive force, within about 10 msec. after the plunger-operating coil 4a has begun to be energized. The pilot hole 4f is now opened to open the valve mechanism 4d, thereby eliminating the counter electromotive force. When the valve mechanism 4d is opened, water in the pressure chamber 4g is discharged through the pilot hole 4f into the urinal 1a. The main valve 4i is opened the instant the lower surface of the diaphragm 4e is lifted off the valve seat 4h.

The plunger 4c thereafter continues to ascend while compressing the coil spring 41 until the upper surface of the plunger 4c abuts against the lower surface of the head 4k, whereupon the counter electromotive force is eliminated.

The magnetic flux generated by the permanent magnet 4m runs in a circulatory path from its outer side through the case 4j, the head 4k, and the plunger 4c back to the inner side of the permanent magnet 4m, so that the plunger 4c remains attracted to the head 4k, maintaining the main valve 4i open as shown in FIG. 8.

For closing the main valve 4i, the plunger-returning coil 4b is energized to produce a magnetic flux in a direction to counter the magnetic flux from the permanent magnet 4m. As the magnetic flux produced by the coil 4b is progressively increased, the plunger 4c starts moving downwardly under the resiliency of the spring 41 within about 10 msec. after the coil 4b has been energized, whereupon a counter electromotive force is produced. When the lower surface of the plunger 4c closes the pilot hole 4f, the valve mechanism 4d is closed, and the counter electromotive force is eliminated. Upon the valve mechanism 4d being closed, water from the water supply flows into the pressure chamber 4g through a small hole 4n defined through the diaphragm 4e radially outwardly of the pilot hole 4f. Under the pressure of the water flowing into the pressure chamber 4g, the diaphragm 4e is seated on the valve seat 4h thus closing the main valve 4i as shown in FIG. 7.

In the above embodiment, the urinal 1a is supplied with water for a predetermined period of time after the user has left the urinal 1a, thereby cleaning the urinal 1a. However, the principles of the invention are not limited to such an arrangement, but other modifications may be possible. For example, the urinal 1a may be supplied with water for precleaning upon elapse of a predetermined period of time after the user has stood in front of the urinal 1a, and may subsequently be supplied with water for post-cleaning for a prescribed period of time after the user left the urinal 1a.

In the aforesaid embodiment, the user sensor control unit 300 controls the light-emitting element to emit infrared radiation at the period 2t, for example 2 seconds, when no user is detected in front of the urinal 1a, and also controls the light-emitting element to emit infrared radiation at the period t, for example 1 second, when a user is detected in front of the urinal 1a and a high signal is issued to the water supply control unit 400, i.e., the latching solenoid 4 is opened. However, the cyclic period of infrared radiation may be t or 1 second only when a user is detected, and may be 2t or 2 seconds when no user is detected and the latching solenoid 4 is opened. Rather than the latching solenoid 4, any of various other general solenoid-operated valves may be employed which are openable in response to a high output signal from the flip-flop 313 and closed in response to a low output signal therefrom.

FIG. 9 shows a user sensor control unit 300 according to another embodiment in which a microcomputer 320 is employed as part of the user sensor control unit 300.

The microcomputer 320 is of a known construction including an input port 321, a CPU 322, a RAM 323, a ROM 324, a timer 325, and an output port 326. The ROM 324 stores a program for controlling the CPU 322 to enable the same to read in external data from the input port 321 and transfer data between the RAM 323 and the timer 325 while processing such data, to deliver the processed data to the output port 326, and to make the output to the water supply control unit 400 high or low.

The output port 326 is responsive to a signal applied by the CPU 322 for issuing a pulse signal to the driver circuit 305 coupled to the microcomputer 320 to start a measurement process. When a signal indicative of the completion of the measurement process is applied to the input port 321, the output port 326 successively applies pulse signals at the period 2t or t to the driver circuit 305 for energizing the light-emitting element 31 to emit infrared radiation.

A decision circuit 317 is coupled to the amplifier circuit 306 for ascertaining whether or not reflected infrared radiation is detected by the light detector circuit 32. Detected data is applied by the decision circuit 317 to the input port 321.

The input port 321 is responsive to a signal from the CPU 322 for reading in a preset detected count from the detected count setting circuit 312 coupled to the microcomputer 320 and a preset output count from the output count setting circuit 318.

Figure 10A:
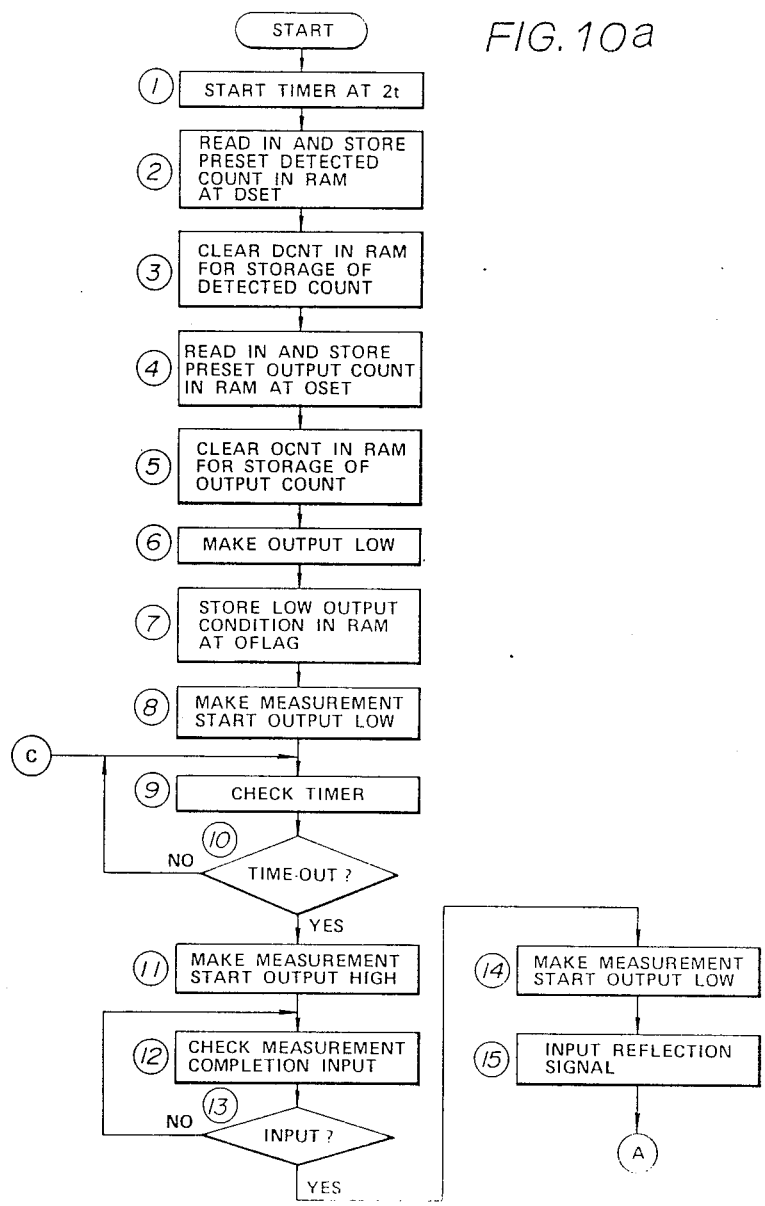
FIGS. 10a and 10b are a flowchart of an operation sequence of the user sensor control unit shown in FIG. 9.
Figure 10B:
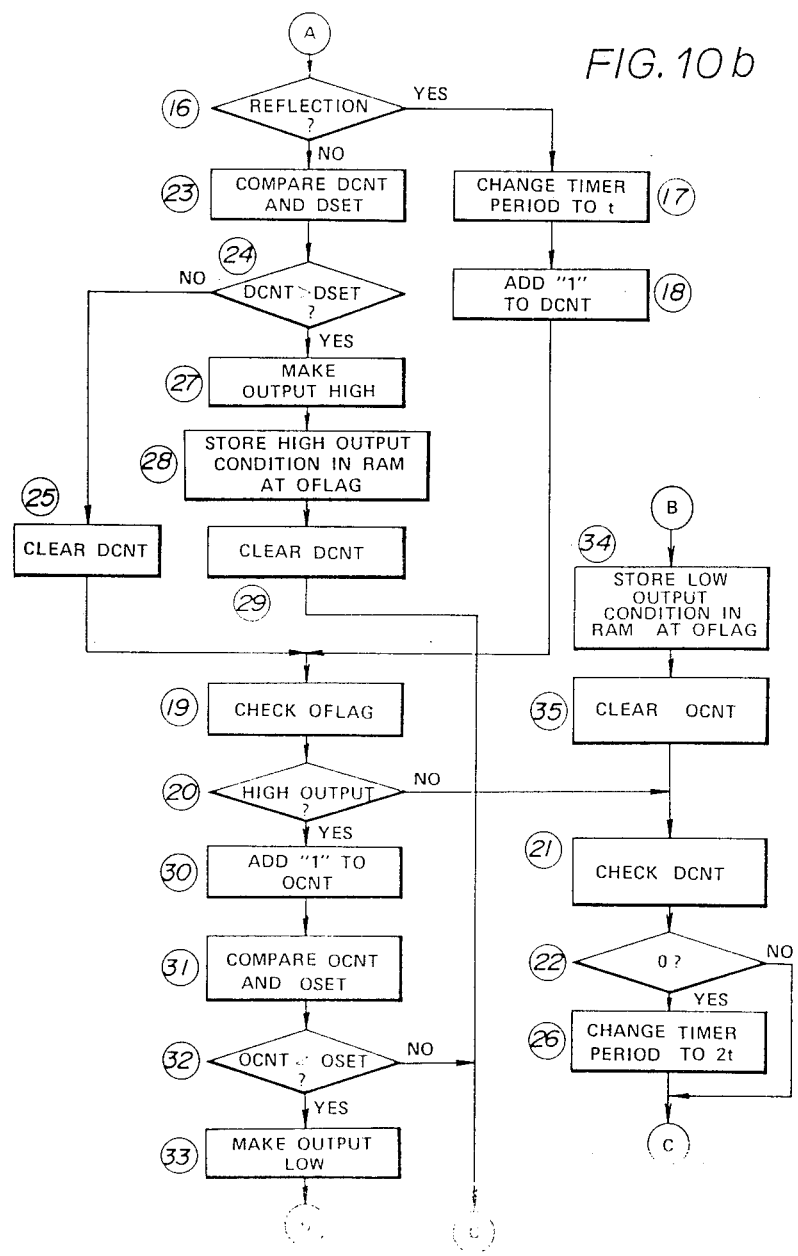

The program written in the ROM 324 is illustrated in the flowchart of FIGS. 10(a) and 10(b), and will be described below with reference thereto.

When the program is started, the microcomputer 320 starts the timer 325 at the period 2t in a step (1) and then reads in a preset detected count, such as "2", from the detected count setting circuit 312 and stores the preset detected count in the RAM 323 at an address DSET in a step (2). Then, the content of an address DCNT in the RAM 323, in which a detected count is to be stored, is cleared to zero in a step (3), and a preset output count, such as "4", from the output count setting circuit 318 is read in and stored in the RAM 323 at an address OSET in a step (4). The content of an address OCNT in the RAM 323, in which an output count is to be stored, is cleared to zero in a step (5). Then, the microcomputer 320 makes the output to the water supply control unit 400 low in a step (6). The low output condition is stored in the RAM 323 at an address OFLAG in a step (7), and the output signal applied to the driver circuit 305 to start a measurement process is rendered low in a step (8), thus completing the initial state.

Thereafter, a step (9) checks the timer 325 to ascertain whether 2t has elapsed on the timer 325 in a step (10). If 2t has elapsed, then the output signal to start a measurement process is rendered high to apply a pulse signal to the driver circuit 305 in a step (11). The step (11) is followed by a step (12) which checks a measurement completion input signal to ascertain whether there is such a measurement completion input signal in a step (13). If there is, then the output signal for starting the measurement process is rendered low in a step (14). Then, an output signal from the decision circuit 317 is read in in a step (15) to determine whether reflected infrared radiation is applied in a step (16).

If infrared radiation is reflected by a user, then the period to which the timer 325 is set is changed from 2t to t in a step (17), and "1" is added to the detected count at the address DCNT in a step (18). Thereafter, control goes to a step (19) which checks the output condition in the address OFLAG to ascertain whether a high output signal is applied to the water supply control unit 400 in a step (20). Since the output signal to the water supply control unit 400 has been rendered low in the step (6), control goes from the step (20) to a step (21) which checks the detected count in the address DCNT to determine if it is "0" or not in a step (22).

Inasmuch as the detected count is "1" in the step (18), control returns from the step (22) to the step (9) and repeats the steps (9) through (22). Each time control goes through the step (18), the detected count is incremented by "1".

If the user leaves the urinal 1a and there is no longer reflected infrared radiation, control goes from the step (16) to a step (23) which compares the detected count in the address DCNT and the preset detected count in the address DSET. If the detected count is not larger than the preset detected count "2" in a step (24), then the detected count in the address DCNT is cleared to "0" in a step (25), and control goes back to the step (19) and then the steps (20) through (22). Since the detected count has been cleared to "0" in the step (25), control proceeds from the step (22) to a step (26) in which the period for the timer 325 is changed from t to 2t. Then control returns to the step (9).

If the detected count is larger than the preset detected count in the step (24), then the output signal applied to the water supply control unit 400 is rendered high in a step (27), and the high output condition is stored in the RAM 323 at the address OFLAG in a step (28). Thereafter, the detected count in the address DCNT is cleared to "0" in a step (29), which is followed by the step (9).

Control then proceeds from the step (9) through the step (16). If there is no reflected infrared radiation, then control goes to the steps (23) through (25), and if there is reflected infrared radiation, then control goes to the steps (17) through (20).

Inasmuch as the output signal applied to the water supply control unit 400 has been rendered high in the step (27), control proceeds from the step (20) to a step (30) in which the output count in the address OCNT is incremented by "1", and thereafter to a step (31) which compares the output count in the address OCNT with the preset output count in the address OSET. If the output count is not larger than the preset output count "4", then control returns to the step (9) and repeats the steps (9) through (31). The output count is incremented by "1" each time control passes through the step (30).

If the output count is larger than or equal to the preset output count in the step (32), control goes to a step (33) in which the output signal applied to the water supply control unit 400 is rendered low, and the low output condition is stored in the RAM 323 at the address OFLAG in a step (34). After the output count in the address OCNT has been cleared to "0" in a step (35), control returns to the step (21) which checks the detected count in the address DCNT to ascertain if it is "0" or not in the step (22). If the user is being detected and hence the detected count is not "0", then the period for the timer 325 remains at the value t and control goes back to the step (9). If the user has left and the detected count is "0", then the period for the timer 325 is changed from t to 2t in the step (26), and thereafter control goes back to the step (9).

The timing chart of operation of the user sensor control unit 300 of FIG. 10 is illustrated in FIG. 11.

Figure 12:
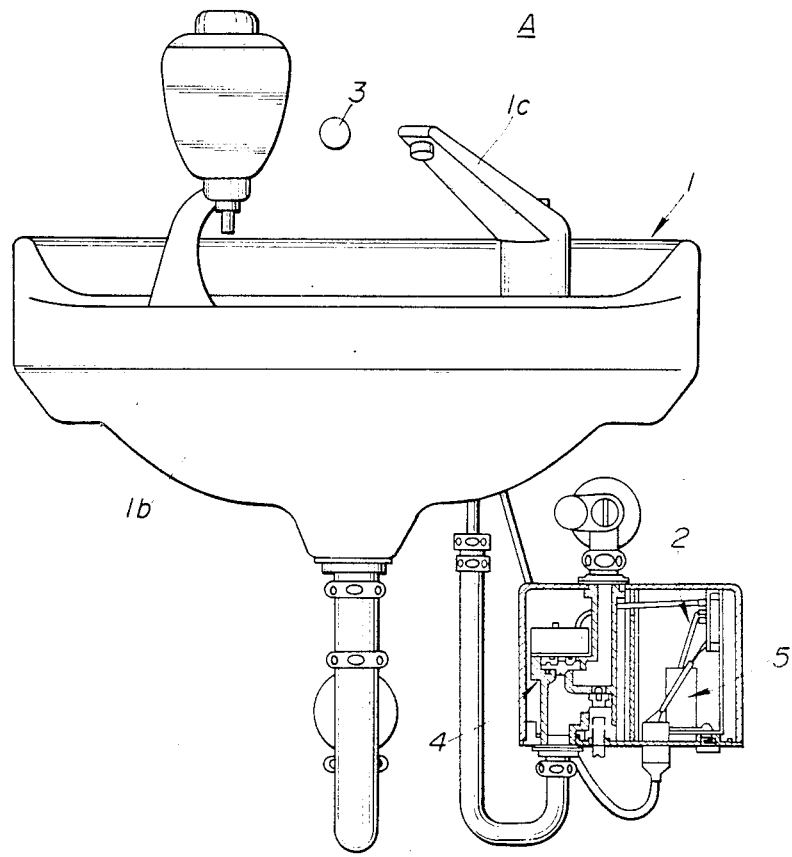
FIG. 12 is a front elevational view, partly cut away, of a wash basin according to a third embodiment of the present invention.

While the flushing device 1 has been shown as the urinal 1a in the above embodiments, the present invention is not limited to such an arrangement, but the flushing device 1 may be a wash basin or bowl 1b as shown in FIG. 12.

A third embodiment in which the flushing device 1 is a wash basin 1b will be described below.

The sensor 3 is embedded in the wall A lying vertically above and behind the wash basin 1b. When a user who approaches the wash basin 1b for hand-washing is detected by the sensor 3, the water supply mechanism 4 is actuated to supply water from a faucet 1c into the wash basin 1b. When the user has left the wash basin 1b, the water supply mechanism 4 is controlled to stop the water supply.

Figure 13:
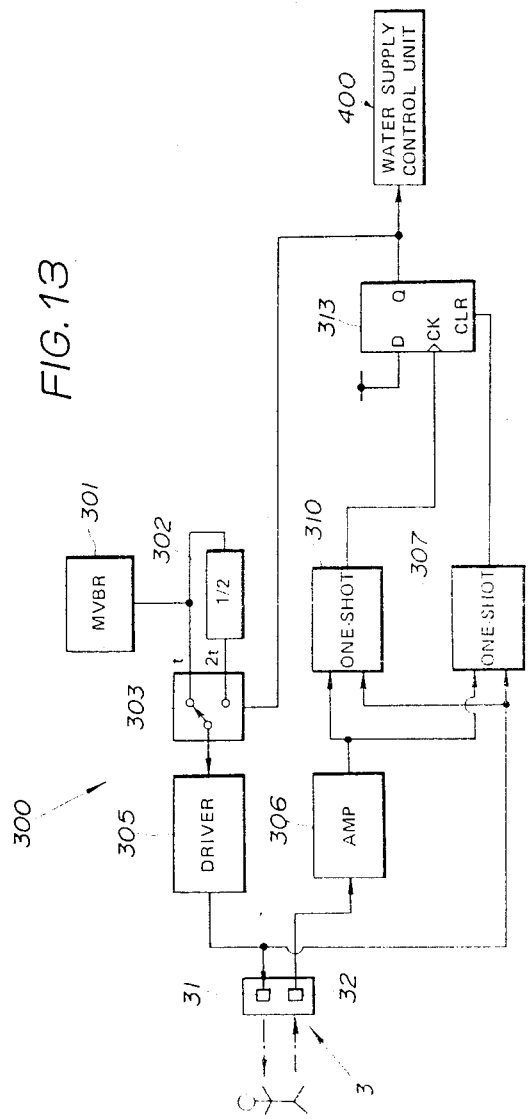
FIG. 13 is a block diagram of a user sensor control unit in the third embodiment.

More specifically, as shown in FIG. 13, the reflection-present one-shot circuit 310 causes the flip-flop 313 to change its output from the low level to the high level, and the reflection-absent one-shot circuit 307 causes the flip-flop 313 to change its output from the high level to the low level. When the output signal from the flip-flop 313 changes from the low level to the high level or vice versa, the water supply control unit 400 operates in the same manner as in the first embodiment.

Figure 14:
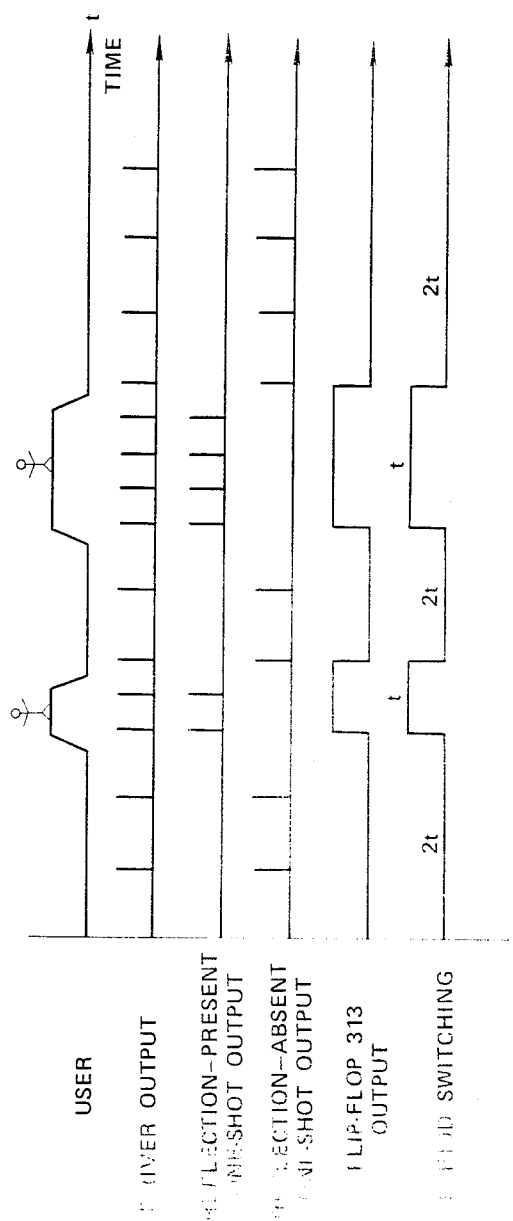
FIG. 14 is a timing chart of operation of the user sensor control unit illustrated in FIG. 13.

While the high output signal is being applied by the flip-flop 313 to the water supply control unit 400, the multiplexer 303 selects the period t, and while the low output signal is being applied by the flip-flop 313 to the water supply control unit 400, the multiplexer 303 selects the period 2t. FIG. 14 shows a timing chart of operation of the user sensor control unit 300 according to the third embodiment.

Although the sensor 3 has been shown as being embedded in the wall A, the sensor 3 may be attached in any other different way than illustrated insofar as it can detect a user present in front of the flushing device 1.

The present invention offers the following advantages:

(1) When the sensor is not detecting a user, infrared radiation is intermittently emitted from the light-emitting element, and when the sensor is detecting a user, the period of intermittent infrared emission is reduced. Therefore, the frequency of emitting infrared radiation can be made lower, without a substantial reduction in the response accuracy, than the conventional apparatus in which several thousands of infrared radiation pulses are emitted per second, with the result that the electric power consumption by the apparatus of the invention is smaller. Consequently, the service life of the battery used is extended, making battery replacement less frequent. This leads to a large reduction in the maintenance cost and also in the labor required for battery replacement.

(2) Since the period of infrared radiation while the sensor is sensing the user is short, the water supply mechanism can be actuated immediately after the user has left the flushing device.

Although there have been described what are at present considered to be the preferred embodiments of the present invention, it will be understood that the invention may be embodied in other specific forms without departing from the spirit or essential characteristics thereof. The present embodiments are therefore to be considered in all aspects as illustrative, and not restrictive. The scope of the invention is indicated by the appended claims rather than by the foregoing description.

We claim:

1. A water supply control apparatus comprising:
   a flushing device to be supplied with water;
   water supply valve means for controlling the supply of water to said flushing device;
   driving signal generator means for selectively generating driving signals of first and second periods, respectively;
   sensor means responsive to one, at a time, of said driving signals for detecting whether there is a user of said flushing device at one of said first and second periods, to produce a sensor signal selectively including a user-present signal and a user-absent signal of said one period;
   control circuit means responsive to said sensor signal for controlling said water supply valve means; and
   said control circuit means including:
      first control means having switching means responsive to said user-absent signal for issuing a first switching signal to said driving signal generator means to generate the driving signal of the first period and responsive to said user-present signal for issuing a second switching signal to said driving signal generator means to generate the driving signal of the second period and output means responsive to said sensor signal for issuing a water supply valve control signal;
      second control means responsive to said water supply valve control signal for controlling said water supply valve means; and
      a battery as a power supply for operating said water supply valve means, said driving signal generator means, said sensor means, and said first and second control means.

2. A water supply control apparatus according to claim 1, wherein said water supply valve means includes a water supply on-off valve and a latching solenoid having solenoid coils for respectively opening and closing said water supply on-off valve, said solenoid coils having respective input terminals connected to said battery.

3. A water supply control apparatus according to claim 1, wherein said second period is shorter than said first period.

4. A water supply control apparatus according to claim 1, wherein said sensor means comprises an infrared radiation sensor having a light-emitting element and a light detector element.

5. A water supply control apparatus according to claim 1, wherein said switching means comprises:
   a first pulse generator responsive to said user-present signal for generating a user-present pulse at each period of said user-present signal;
   a second pulse generator responsive to said user-absent signal for generating a user-absent pulse at each period of said user-absent signal; and
   hold means responsive to the water supply valve control signal from said output means for holding said second switching signal.

6. A water supply control apparatus according to claim 5, wherein said first control means further includes counter means for continuously issuing a high-level output signal from the time when it counts a predetermined number of successive user-present pulses from said first pulse generator and for cutting off said high-level output signal when it counts said user-absent pulse, said output means continuously issuing said water supply valve control signal when it has received said high-level output signal.

7. A water supply control apparatus according to claim 6, wherein said first control means further includes stopper means for stopping said water supply valve control signal from said output means when the number of second periods of the driving signal from said driving signal generator means has reached a predetermined number while said water supply valve control signal is being supplied from said output means.

8. A water supply control apparatus according to claim 7, wherein said water supply valve means includes a water supply on-off valve and a latching solenoid having solenoid coils for respectively opening and closing said water supply on-off valve, said solenoid coils having respective input terminals connected to said battery.

9. A water supply control apparatus according to claim 8, wherein said second control means comprises:
   pulse generator means for generating a valve-opening pulse when said water supply valve control signal starts to be received and a valve-closing pulse when said water supply valve control signal has been received;
   valve-opening energizing means for supplying an electric current from said battery to said valve-opening solenoid coil;
   valve-closing energizing means for supplying an electric current from said battery to said valve-closing solenoid coil;
   energization selecting means responsive to said valve-opening pulse for applying an energization signal to said valve-opening energizing means and responsive to said valve-closing pulse for applying an energization signal to said valve-closing energizing means; and
   inflection point detecting means for detecting inflection points inherent in said valve-opening and -closing solenoid coils when the valve-opening and -closing solenoid coils are energized.

10. A water supply control apparatus according to claim 9, wherein said inflection point detecting means comprises comparator means responsive to an energization current from at least one of said valve-opening and -closing solenoid coils via the corresponding energizing means for comparing the current from said one solenoid coil with a current curve inherent in said one solenoid coil thereby to detect said inflection point, and for generating a detection completion signal after said inflection point has been detected.

11. A water supply control apparatus according to claim 9, wherein said inflection point detecting means comprises comparator means responsive to an energization current from said valve-closing solenoid coil via said valve-closing energizing means for comparing the current from said valve-closing solenoid coil with a current curve inherent in said valve-closing solenoid coil thereby to detect said inflection point, and for generating a detection completion signal after said inflection point has been detected.

12. A water supply control apparatus according to claim 10, wherein said energization selecting means has input means for receiving said detection completion means, and is responsive to said detection completion means for issuing a de-energization signal to said valve-opening and -closing energizing means.

13. A water supply control apparatus according to claim 12, wherein said energization selecting means has energization stopping means for forcibly cutting off the energization signal applied to at least one of said valve-opening and -closing energizing means upon lapse of a predetermined period of time after said valve-opening pulse has been applied.

14. A water supply control apparatus according to claim 13, wherein said energization selecting means further includes a warning lamp energizable at the same time that said energization stopping means is operated.

15. A water supply control apparatus according to claim 1, wherein said water supply valve means comprises a solenoid-operated valve openable in response to said water supply valve control signal and closable in the absence of said water supply valve control signal.

* * * * *